United States Patent
Shah et al.

(10) Patent No.: US 11,940,577 B1
(45) Date of Patent: Mar. 26, 2024

(54) WIDE BANDGAP SEMICONDUCTOR RADIATION DETECTORS

(71) Applicant: Radiation Monitoring Devices, Inc., Watertown, MA (US)

(72) Inventors: Kanai S. Shah, Watertown, MA (US); Leonard Cirignano, Cambridge, MA (US); Hadong Kim, Methuen, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 15/788,646

(22) Filed: Oct. 19, 2017

(51) Int. Cl.
*G01T 1/20* (2006.01)
*G01T 1/16* (2006.01)
*G01T 1/22* (2006.01)
*G01T 1/24* (2006.01)
*G01T 3/00* (2006.01)
*G01T 3/06* (2006.01)
*H01L 31/032* (2006.01)
*H01L 31/08* (2006.01)

(52) U.S. Cl.
CPC ........... *G01T 1/241* (2013.01); *G01T 1/16* (2013.01); *G01T 1/2006* (2013.01); *G01T 1/22* (2013.01); *G01T 1/24* (2013.01); *G01T 3/00* (2013.01); *G01T 3/008* (2013.01); *G01T 3/06* (2013.01); *H01L 31/032* (2013.01); *H01L 31/085* (2013.01)

(58) Field of Classification Search
CPC .. G01T 1/241; G01T 3/00; G01T 3/06; G01T 1/24; G01T 1/16; G01T 1/2006; G01T 1/22; G01T 3/008; H01L 31/085; H01L 31/032
See application file for complete search history.

(56) References Cited

U.S. PATENT DOCUMENTS

| | | |
|---|---|---|
| 3,714,057 A | 1/1973 | Hofstadter et al. |
| 7,067,816 B2 | 6/2006 | Dorenbos et al. |
| 7,368,719 B2 | 5/2008 | Srivastava et al. |
| 7,405,404 B1 | 7/2008 | Shah |
| 7,655,919 B1 | 2/2010 | Shah et al. |
| 7,854,961 B1 | 12/2010 | Brecher et al. |
| 7,910,894 B2 | 3/2011 | Kraemer et al. |
| 8,415,637 B1 | 4/2013 | Shah et al. |
| 8,440,980 B2 | 5/2013 | Shah et al. |
| 8,575,553 B1 | 11/2013 | Shah et al. |
| 8,586,935 B2 | 11/2013 | Shah et al. |

(Continued)

FOREIGN PATENT DOCUMENTS

RU 2066464 C1 9/1996

OTHER PUBLICATIONS

D. J. Leopold, teaches "Development of high efficiency UV/Blue photocathode epitaxial semiconductor heterostructures for scintillation and Cherenkov radiation detection", 2002, downloaded from https://ntrs.nasa.gov/rearch.jsp?R=20020080604, 13 pages. (Year: 2002).*

*Primary Examiner* — Kiho Kim
(74) *Attorney, Agent, or Firm* — Wolf, Greenfield & Sacks, P.C.

(57) ABSTRACT

Systems and methods for detecting radiation are generally described. The radiation detector comprises at least one semiconductor material, such as a thallium halide, that provides an electrical signal and optical signal upon exposure to a source of radiation. The electrical signal and optical signal may both be measured to detect the radiation.

16 Claims, 8 Drawing Sheets

(56) References Cited

U.S. PATENT DOCUMENTS

| | | |
|---|---|---|
| 8,779,365 B2 | 7/2014 | Williams |
| 8,969,824 B2 | 3/2015 | Shah et al. |
| 9,116,249 B1 * | 8/2015 | Claus ........................ G01T 1/16 |
| 10,054,691 B1 * | 8/2018 | Wrbanek ................. G01J 1/429 |
| 10,371,831 B2 | 8/2019 | Shah et al. |
| 11,254,867 B1 | 2/2022 | Hawrami et al. |
| 11,384,285 B2 | 7/2022 | Shah et al. |
| 2005/0208290 A1 | 9/2005 | Patel |
| 2007/0131866 A1 | 6/2007 | Srivastava et al. |
| 2008/0001087 A1 | 1/2008 | Srivastava et al. |
| 2008/0131347 A1 | 6/2008 | Srivastava et al. |
| 2010/0163735 A1 | 7/2010 | Menge et al. |
| 2011/0024634 A1 | 2/2011 | Shah et al. |
| 2011/0024635 A1 | 2/2011 | Shah et al. |
| 2011/0223323 A1 | 9/2011 | Ohashi et al. |
| 2013/0320836 A1 | 12/2013 | Kanatzidis et al. |
| 2013/0341511 A1 | 12/2013 | Shah et al. |
| 2014/0008550 A1 | 1/2014 | Williams |
| 2014/0021410 A1 | 1/2014 | Carey et al. |
| 2014/0332689 A1 | 11/2014 | Van Loef et al. |
| 2014/0346400 A1 | 11/2014 | Pei et al. |
| 2014/0363674 A1 | 12/2014 | Zhuravleva et al. |
| 2015/0153463 A1 | 6/2015 | Shah et al. |
| 2015/0301197 A1 | 10/2015 | Wei et al. |
| 2016/0131769 A1 * | 5/2016 | Wieczorek .............. G01T 1/241 |
| | | 250/369 |
| 2016/0291169 A1 | 10/2016 | Hawrami et al. |
| 2018/0277608 A1 * | 9/2018 | Lifka .................... G01T 1/2018 |

\* cited by examiner

WIDE BANDGAP SEMICONDUCTOR RADIATION DETECTORS

TECHNICAL FIELD

Systems and methods related to radiation detectors including a wide band gap semiconductor are generally described.

BACKGROUND

Radiation detection is of major interest in a host of applications, including nuclear medicine, fundamental physics, industrial gauging, baggage scanners, oil well logging, and the like. Semiconductor devices (such as cadmium zinc telluride), scintillation devices comprising a scintillator and a photodetector (such as a photomultiplier tube (PMT)) or a semiconductor photodetector (such as silicon avalanche photodiodes (Si-APDs)) are widely used for the detection of radiation (such as x-rays, gamma rays, and particles such as neutrons and alpha particles). Certain high-atomic number, wide band gap semiconductor (e.g., thallium bromide) radiation detectors can have advantages compared to other semiconductor radiation detectors, such as higher photoelectric and total attenuation coefficients and room temperature operation. The timing performance of semiconductor detectors limit their applicability in applications where fast timing is needed. Accordingly, improved wide band gap semiconductor (e.g., thallium bromide) radiation detectors and methods of use are needed.

SUMMARY

Systems and methods related to radiation detectors including a wide band gap semiconductor are generally described.

In one aspect, a method for detecting radiation is provided. The method comprises exposing a wide bandgap semiconductor to a source of radiation to generate an electrical signal and an optical signal and detecting radiation by measuring the electrical signal and the optical signal.

In one aspect, a system for detecting radiation is provided. The system comprises a wide bandgap semiconductor arranged to be exposed to a source of radiation to generate an electrical signal and an optical signal. The system further comprises a detector configured to measure the electrical signal and the optical signal to detect the radiation.

Other aspects, embodiments and features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Systems and methods related to radiation detection are generally described. The systems and methods utilize a radiation detector comprising a wide band gap semiconductor material that is capable of detecting radiation (e.g., gamma rays) upon exposure to a source of radiation. For example, the semiconductor material may comprise a thallium halide (e.g., thallium bromide, TlBr) with a wide bandgap (e.g., 2.0 eV). As described further below, the systems and methods detect radiation by measuring the electrical signal and the optical signal (e.g., resulting from Cherenkov light and/or radiation) generated within the wide band gap semiconductor material. Both signals may be used to determine different types of information about the radiation. For example, the optical signal may be used to obtain radiation timing information and the electrical signal may be used to obtain radiation energy information. The combined use of electrical and optical signals can lead to a number of advantages and enables the systems and methods described herein to have beneficial properties, such as enhanced stability, sensitivity, and efficiency, amongst others.

Figure 1:
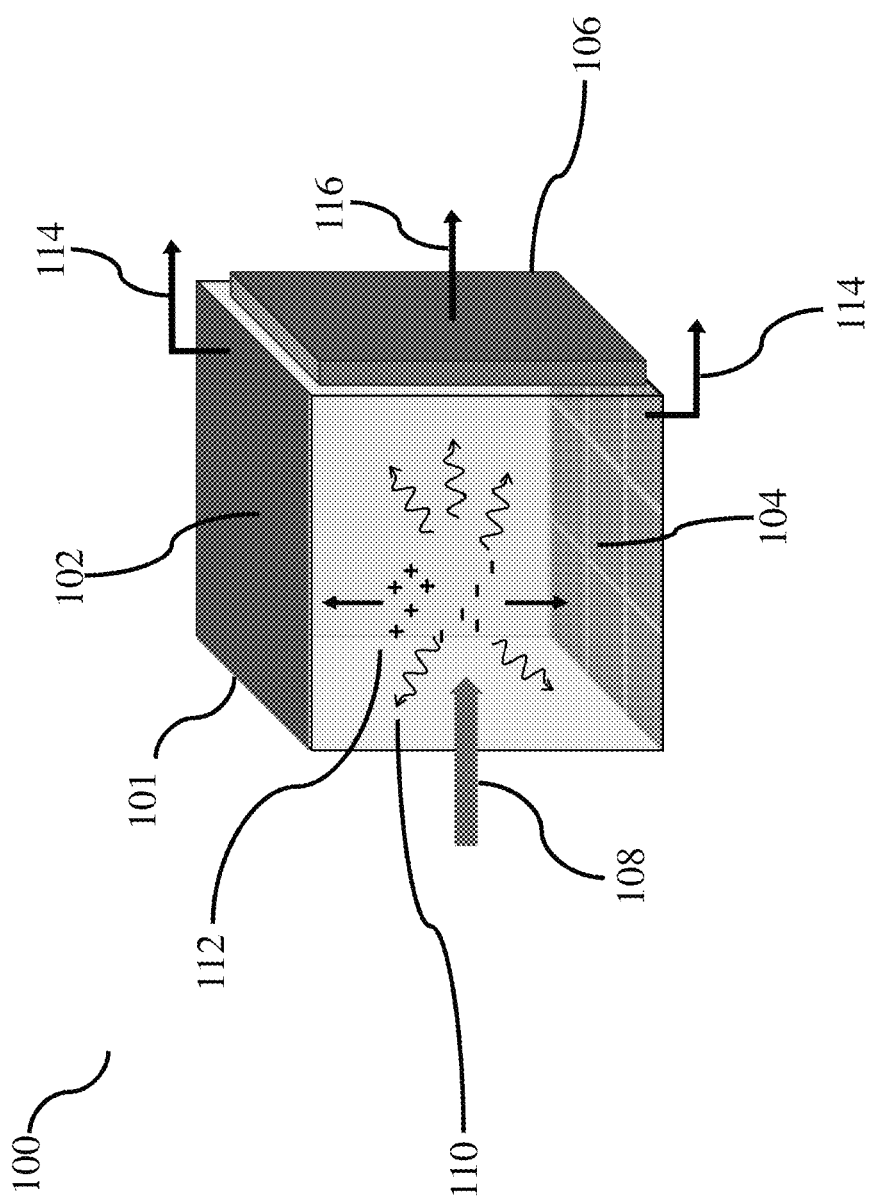
FIG. 1 illustrates a representation of a radiation detector comprising a semiconductor material with electrodes for charge readout and one optical detector for light readout.

A non-limiting example of a scintillation device is shown in FIG. 1. The illustrated scintillation device is a radiation detector 100 which comprises a semiconductor material 101 (e.g., TlBr). Upon exposure to a source of radiation, the semiconductor material may be capable of providing an electrical signal and/or an optical signal, as described further below.

Radiation detector 100 may include a face comprising a first electrode 102 (e.g., a cathode) and another face comprising a second electrode 104 (e.g., an anode). According to certain embodiments, the electrodes may both be continuous electrodes. In certain other embodiments, the electrodes may both be pixel electrodes. In some cases, one electrode may be a pixel electrode and the second electrode may be a continuous electrode. The radiation detector may include a third face that comprises a photodetector 106 (e.g., a photomultiplier tube).

As shown in FIG. 1, the radiation detector may be capable of detecting radiation upon exposure to a source of radiation 108 (e.g., gamma rays). According to certain embodiments, upon exposure to radiation, the semiconductor material may provide an electrical signal 114. In certain embodiments, the electrical signal results from charge collected by one or both of electrodes 102, 104 by electronic charge carriers 112 which are generated by exposing the semiconductor material to radiation. The generated electrical signal may be measured using a first readout and, in some cases, the first readout may be a detection assembly.

As shown in FIG. 1, upon exposure to radiation, the semiconductor material may also provide an optical signal 116. In certain embodiments, the optical signal arises from fast scintillation of light and/or radiation (e.g. Cherenkov light and/or radiation). In some cases, the generated optical signal comprises light transfer from photons 110. The generated optical signal 116 may be measured using a second readout that is different from the first readout described above. According to certain embodiments, the second readout may be a detection assembly that comprises photodetector 106 (e.g., a photomultiplier tube).

As described herein, the radiation detector may comprise any number of faces that have any number of electrodes and/or photodetectors. In some embodiments, the electrical signal and optical signal measurement is done from one or more faces of the detector. In some embodiments, the electrical signal and optical signal measurement are done from the same face of the detector. In some embodiments, the electrical signal and optical signal measurement are done from different faces of the detector.

Figure 2:
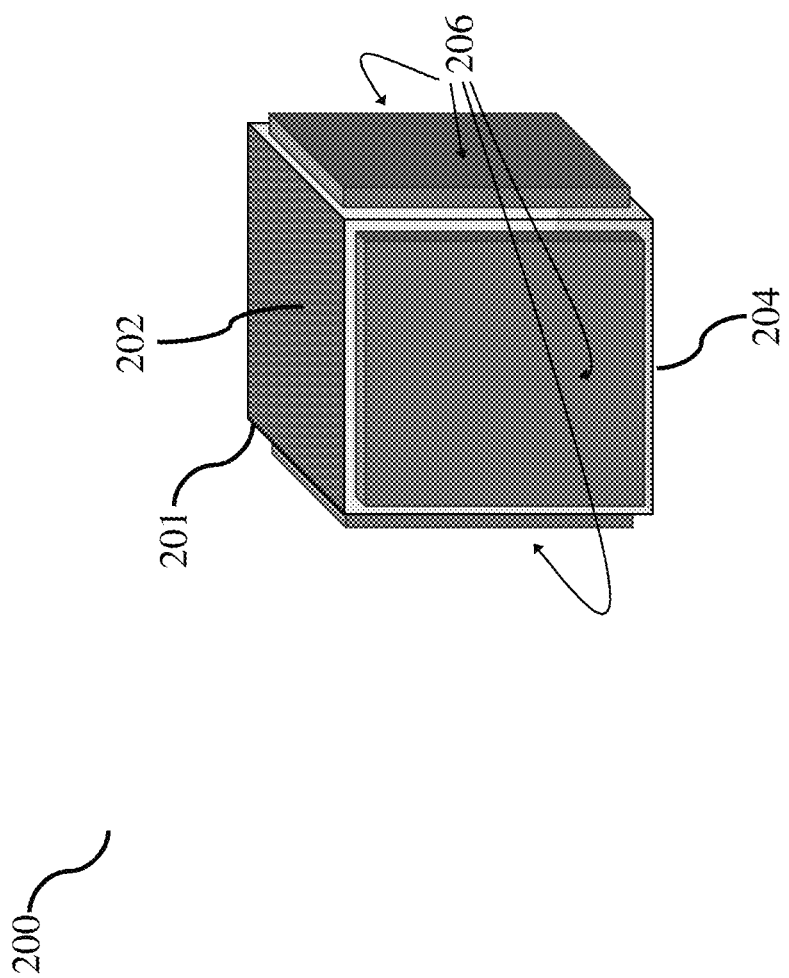
FIG. 2 shows, according to some embodiments, a representation of a radiation detector comprising a semiconductor material with electrodes for charge readout and four optical detectors for light readout.

For example, a non-limiting embodiment of radiation detector 200 is shown in FIG. 2. For example, as shown, the radiation detector comprises electrode 202 (e.g., a continuous top electrode) and electrode 204 (e.g., continuous bottom electrode). Electrode 202 and electrode 204 may respectively be a cathode and an anode, according to some embodiments. As shown, the radiation detector 200 may comprise multiple photodetectors 206 which are positioned on four faces of the detector.

Figure 3:
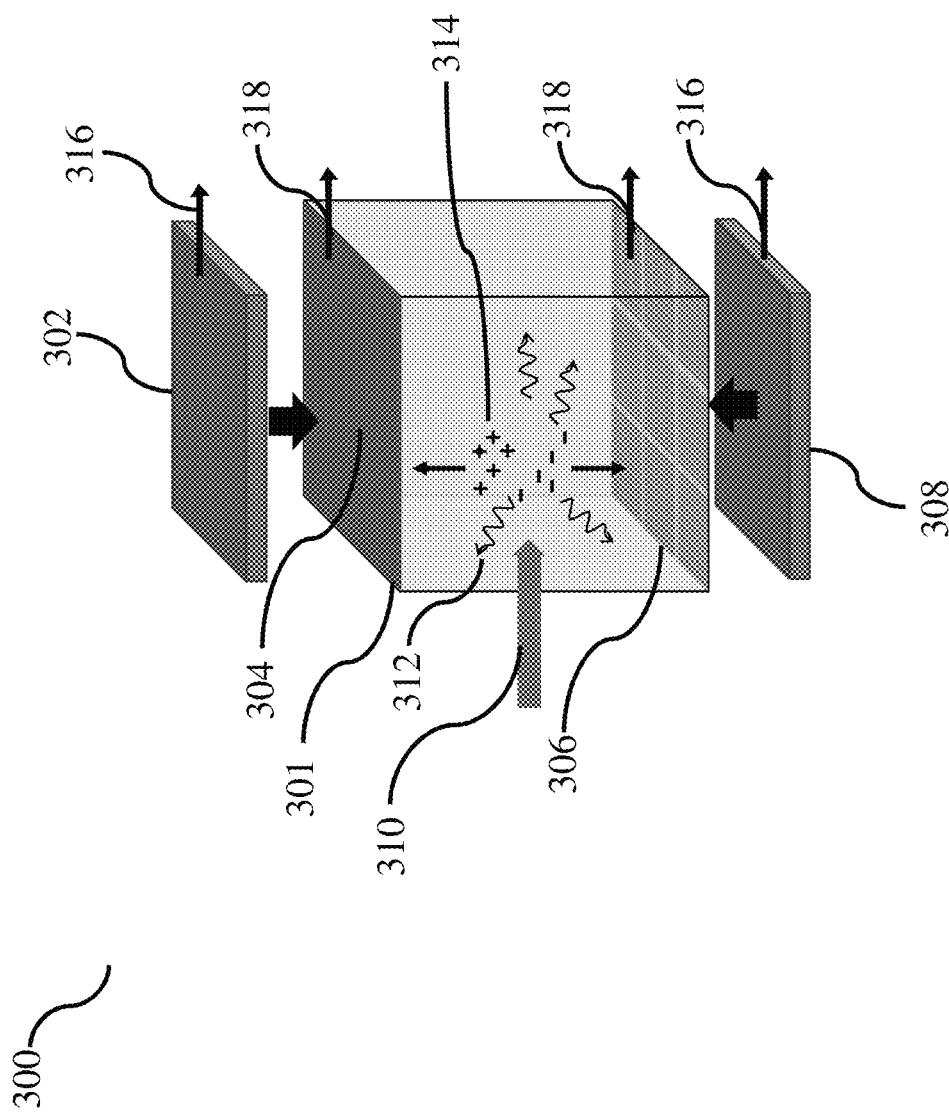
FIG. 3 illustrates a representation of a radiation detector comprising two photodetectors coupled to two semi-transparent electrodes for both charge and light readout.

Another non-limiting example of a radiation detector 300 is also shown in FIG. 3. The radiation detector comprises a semiconductor material 301 (e.g. TlBr). According to certain embodiments, the radiation detector may comprise more than two electrodes (three, four, etc.). In some further embodiments, one or more (e.g., two) electrodes may be mated with a photodetector. For example, also comprised within the radiation detector may be a photodetector mated continuous top electrode 302, optically transparent continuous electrode 304, optically transparent pixel electrode 306, and photodetector mated pixel electrode 308. It should be understood that in certain other embodiments, a photodetector may not be mated with an electrode.

As described above, the radiation detector may be exposed to source of radiation (e.g., gamma rays). Upon exposure to the source, the semiconductor material may provide an electrical signal 318 and/or optical signal 316. As described in connection with other embodiments, the electrical signal may comprise charge transfer and the optical signal may comprise light transfer arising from fast scintillation of light and/or radiation (e.g. Cherenkov light and/or radiation). According to certain embodiments, the electrical signal may be provided due to electronic charge carriers 314 and the optical signal may be provided due to photons 312 upon exposure of radiation detector 300 to source of radiation 310.

As mentioned above, a detector for detecting radiation comprises a semiconductor material. In some embodiments, the radiation detectors comprise a semiconductor material with a relatively wide band gap. As used herein, a band gap is understood by those skilled in the art and generally refers to the energy difference between the top of the valence band of a material and the bottom of the conduction band for a material. More specifically, it is the energy required for the promotion of a valence electron of a material to become a conducting electron of the material, which is free to move within the crystal lattice of the material and serve as a charge carrier to conduct an electric current. The semiconductor materials described herein may have a band gap greater than or equal to about 1 eV, greater than or equal to about 1.2 eV, greater than or equal to 1.5 eV, greater than or equal to about 2.0 eV, or greater than or equal to about 2.2 eV. In some instances, the semiconductor materials described herein have a band gap less than or equal to about 3.0 eV.

In some embodiments, the semiconductor material has a refractive index of at least about 1.2; or, in some cases, at least about 1.5.

In some embodiments, the semiconductor material comprises thallium. The semiconductor material may comprise one compound of thallium such as a thallium halide. For example, the semiconductor material may comprise thallium bromide thallium iodide, thallium chloride, thallium fluoride and/or mixtures thereof. In some embodiments, thallium bromide is preferred. It should be understood that thallium halides can be used alone, or mixtures of different thallium halides can be used (e.g., a mixture of thallium bromide and thallium chloride).

In various other embodiments, the semiconductor material comprises materials other than thallium. For example, the semiconductor material may comprise a Group IV compound (e.g., a compound with carbon, silicon, germanium, tin, lead, etc.). In some embodiments, the semiconductor material comprises Si, Ge, SiC, and the like. According to some embodiments, mixtures of Group IV compounds may also be used (e.g., Si and Ge). In other certain embodiments, the semiconductor material comprises mixtures of Group III and Group V compounds (e.g., GaAs and/or GaN). In some other embodiments, the semiconductor material comprises mixtures of Group II and Group VI compounds (e.g., CdS and/or CdTe). According to certain embodiments, the semiconductor material comprises mixtures of Group IV and Group VI compounds (e.g., PbS). In certain embodiments, the semiconductor material is a polynuclear semiconductor (e.g., CdZnTe). Combinations of any of the aforementioned semiconductor materials can also be used (e.g., thallium bromide and CdZnTe). In some embodiments, semiconductor material is selected from the group consisting of $HgX_2$, $PbX_2$ and $BiX_3$, wherein X is F, Cl, Br, I or any combination thereof. According to certain embodiments, the semiconductor material can comprise any combination of the following elements: Tl, Bi, Hg, Pb, Cd, In, Zn, Ga, Al, P, Sb, As, Te, Se, S, O, Au, Ag, I, Br, Cl, F, Si, C and the like.

In some embodiments, the semiconductor material has a high detection efficiency (e.g., for 511 keV photons), high coincidence timing resolution, and/or high energy resolution.

As described above, some embodiments are directed to methods for detecting radiation. A method for detecting radiation may comprise exposing a radiation detector to a source of radiation (e.g., gamma rays). According to certain embodiments, as described above, upon exposure to a source of radiation, the radiation detector comprising a wide bandgap semiconductor may provide an electrical signal and an optical signal. According to certain embodiments, the electrical signal may comprise a charge transfer. In further certain embodiments, the optical signal may comprise a light transfer. In some instances, the presence or absence of radiation may be determined by the presence or absence, respectively, of an electrical signal. According to certain further embodiments, the presence or absence of radiation may be determined by the presence or absence, respectively, of an optical signal. In some cases, upon exposure of a semiconductor material comprised within a radiation detector to a source of radiation, the semiconductor material may provide an electrical signal and/or an optical signal simultaneously. In certain other embodiments, the semiconductor material may provide an electrical signal and/or an optical signal asynchronously. According to certain embodiments, the electrical and/or optical signal generated upon exposure to a source or radiation can be read by a readout, which is described further herein.

According to certain embodiments, the electrical signal and/or optical signal may be used in combination to obtain information about the radiation being detected. The energy, position, and timing of a radiation event may be deduced from measuring the combination of the electrical signal and optical signal. For example, the signals may be used to obtain information about the position of the radiation, the decay of the radiation (e.g., Time-of-Flight, TOF), the energy of the radiation and the timing of the radiation. In some embodiments, the information may be used to obtain a better timing resolution, and/or a better signal-to-noise ratio for better imaging quality.

In some cases, the electrical signal results from charge transfer of electronic charge carriers (e.g., protons and electrons). The electrical signal may be measured by an electrical detector assembly that includes one or more electrode contacts. For example, the detector assembly may further comprise an anode, a cathode, and one or more wires (e.g., palladium wires) connecting the anode and the cathode to the one or more electrode contacts of the radiation detector. In certain embodiments, a bias voltage may be applied across the radiation detector. Upon exposure of the detector assembly to a source of radiation, the radiation detector may generate electron-hole pairs. In some instances, exposure to a source of radiation may generate ion vacancies in the radiation detector. Due to the applied bias voltage, the electrons, holes, and/or ion vacancies may travel to the electrode contacts of the radiation detector. The flow of electrons, for example, may generate an electrical signal that can be detected and/or measured. The electrical signal generated may be proportional to the energy of the radiation absorbed by the radiation detector.

The electrical detector assembly may include a first readout. In certain embodiments, the first readout (e.g., electrical detector assembly) comprises one or more of continuous electrodes, pixelated electrodes, coplanar electrodes, a Frisch-Grid design, hemispherical electrode or surface, strips (e.g., orthogonal strips, conductive strips), and the like. In some cases, an electrode may comprise any material that is substantially electrically conductive. The electrode may be transparent, semi-transparent, semi-opaque, and/or opaque. The electrode may be a solid, semi-porous or porous. Non-limiting examples of electrodes include indium tin oxide (ITO), fluorine tin oxide (FTO), glassy carbon, metals, lithium-containing compounds, metal oxides (e.g., platinum oxide, nickel oxide), graphite, nickel mesh, carbon mesh, and the like. Non-limiting examples of suitable metals include gold, copper, silver, platinum, nickel, cadmium, tin, and the like. The electrodes may also be any other metals and/or non-metals known to those of ordinary skill in the art as conductive (e.g., indium tin oxides). The electrode may be of any size or shape. Additionally, the electrode may comprise a means to connect the electrode to another electrode, a power source, and/or another electrical device.

In some embodiments of the radiation detector, an electrode may be optically transparent. According to certain embodiments, one or more electrodes (e.g., two) may be mated with a photodetector. In certain embodiments, one or more electrodes mated with a photodetector may be coupled with one or more electrodes that are optically transparent.

As described above, the radiation detector comprises a wide bandgap semiconductor that provide an optical signal comprising light transfer upon exposure to a source of radiation. In certain cases, the optical signal arises from fast scintillation radiation and/or light. In certain embodiments, the fast scintillation radiation and/or light is Cherenkov radiation and/or light. In some embodiments, the optical signal comprising light transfer may be photons. According to some cases, the optical signal generated can allow for fast timing resolution (e.g., sub nanosecond timing resolution).

According to certain embodiments, a method for detecting radiation may be carried out using a photodetector assembly. The photodetector assembly may be a second readout comprised within the radiation detector. In some cases, the second readout (e.g., photodetector assembly) comprises a photodetector capable of measuring an optical signal arising from fast scintillation radiation and/or light (e.g., Cherenkov radiation and/or light). For example, the photodetector assembly may comprise a photodiode such as a photomultiplier tube (e.g., silicon photomultiplier, wide bandgap photomultiplier), pin diodes, silicon diodes, wide bandgap diodes, avalanche photodiodies, photoconductors, and the like.

In certain embodiments, the optical signal comprising light transfer is used as a trigger. In some further embodiments, the optical signal comprising light transfer is used as a timing signal for TOF applications. According to certain embodiments, the electrical signal generated may be proportional to the energy of the radiation absorbed by the radiation detector.

In some embodiments, a detector comprising a semiconductor material, described herein, has an enhanced charge collection and accordingly detector efficiency. The detector may exhibit improved detector efficiency over a relatively long period of time. In some instances, the improved detector efficiency has the same time scale as the stability. In some embodiment, detector, described herein, may be relatively stable at higher temperatures (e.g., room temperature) than conventional ionic semiconductor materials.

It should be understood that the detectors, as described herein, can be used to detect radiation. In some embodiments, the radiation comprises gamma rays. In some cases, the gamma rays may be emitted by a nucleus (e.g., during a radioactive decay process). In some embodiments, the gamma rays have an energy of greater than or equal to about 20 keV, greater than or equal to about 100 keV, greater than or equal to about 200 keV, greater than or equal to about 500 keV, or greater than or equal to about 1 MeV. In some embodiments, the radiation comprises X-rays, cosmic rays, particles, electrons, neutrons, and the like. Combinations of the embodiments of radiation are also possible.

The radiation detectors described herein can be used in any suitable radiation detection applications. For example, the radiation detectors can be used in positron emission tomography, computed tomography, high energy physics, low energy nuclear physics, nuclear non-proliferation, homeland security, and the like. In certain embodiments, the radiation detectors described herein can be used in any application employing TOF information.

In some embodiments, a radiation detector assembly can include a data analysis or computer system (e.g., data acquisition and/or processing device) to process information from the radiation detector. The radiation detector assembly can convert the absorbed radiation into an electrical signal that may be shaped, digitized, or processed, for example, by the associated electronics.

The data analysis, or computer system thereof can include, for example, a module or system to process information (e.g., radiation detection data or signals) from the radiation detector and can further include, for example, a wide variety of proprietary or commercially available computers, electronics, or systems having one or more processing structures, a personal computer, mainframe, or the like, with such systems often comprising data processing hardware and/or software configured to implement any one (or combination of) the method steps described herein. Any software will typically comprise machine readable code of programming instructions embodied in a tangible media such as a memory, a digital or optical recording media, optical, electrical, or wireless telemetry signals, or the like, and one or more of these structures may also be used to transmit data and information between components of the system in any of a wide variety of distributed or centralized signal processing architectures.

The radiation detector system can be connected to a variety of tools and devices. Non-limiting examples include nuclear weapons monitoring and detection devices, well-logging tools, and imaging devices, such as nuclear medicine devices (e.g., PET). Semiconductor materials of the present invention, e.g., due to high-detection efficiency and/or relatively thin profile or sizing, can be incorporated into smaller or more compact devices or systems, including hand-held probes, detectors, or dosimeters, portal monitoring structures, and the like.

The radiation detector system may also be connected to a visualization interface, imaging equipment, or digital imaging equipment.

The following examples are intended to illustrate certain embodiments of the present invention, but do not exemplify the full scope of the invention.

EXAMPLE

Figure 4:
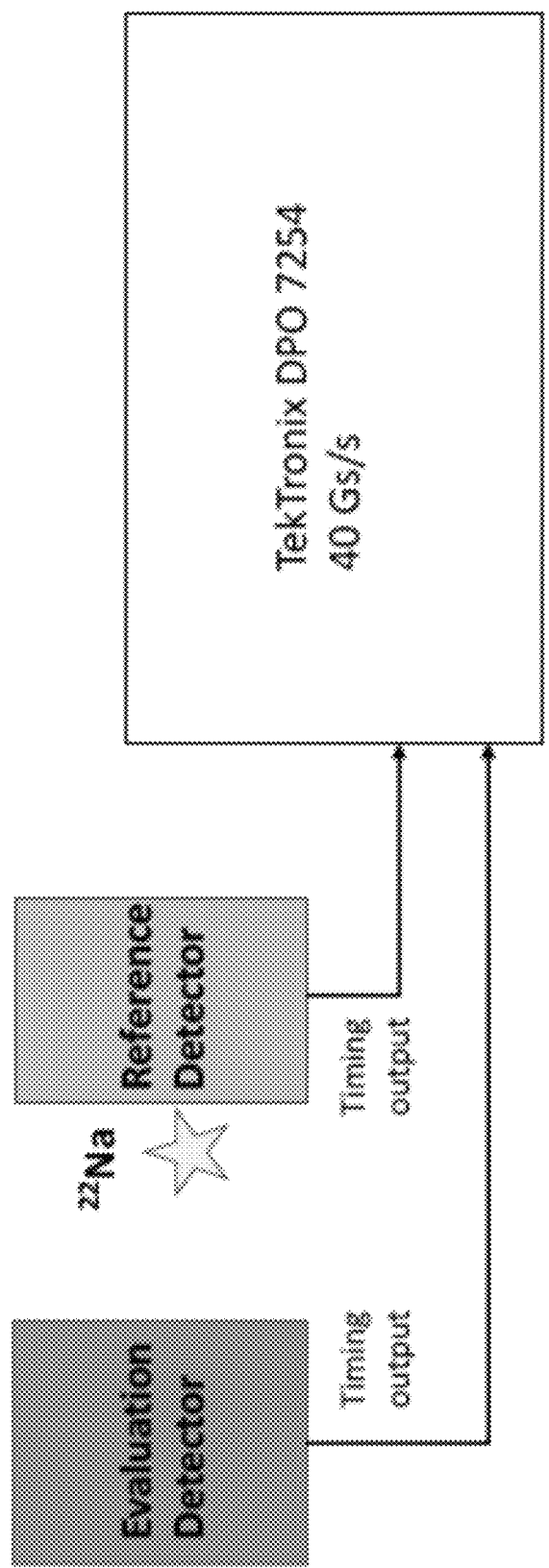
FIG. 4 illustrates a basic scheme for coincidence timing measurements, according to some embodiments.

This example describes methods and systems for radiation detection with a wide band gap semiconductor. A basic detector for measurements is shown in FIG. 4. The evaluation detector (e.g., semiconductor) comprises a 3 mm×3 mm×5 mm thallium bromide (TlBr) substrate optically coupled to a silicon photomultiplier (SiPM). The 3 mm×3 mm faces of the TlBr were polished. The reference detector was a LYSO (lutetium-yttrium oxyorthosilicate, $Lu_{1.8}Y_{0.2}SiO_5Ce$) scintillator coupled to a SiPM. The SiPM signals were recorded with a digital oscilloscope.

Figure 5:
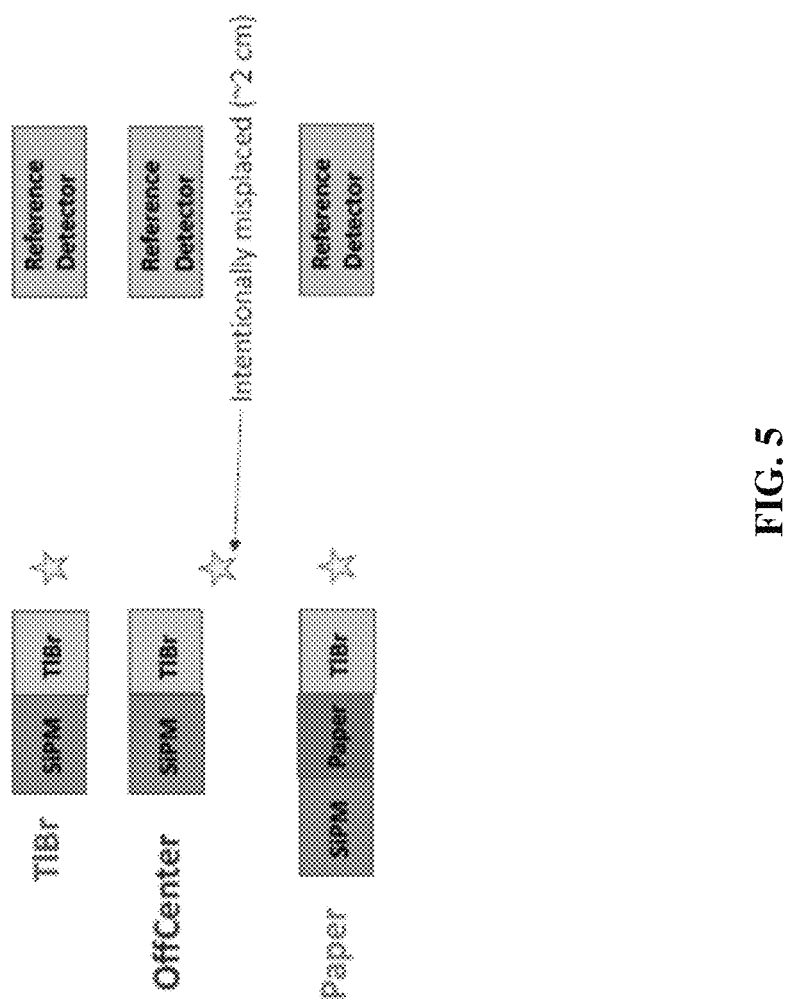
FIG. 5 shows, according to some embodiments, three experimental configurations for data acquisition.

Measurements were made under three different conditions in order to verify that the measured coincidence timing resolution was due to signals generated by Cherenkov radiation from TlBr. The experimental conditions are shown in FIG. 5. At the top of the figure, the standard configuration for coincidence timing measurements is shown whereby the reference detector, positron source and detector under test (e.g. TlBr) are collinear. For this case, two 511 keV gamma-rays emitted at (approximately) 180 degrees from each other can be recorded by each detector "in coincidence." In the middle of the figure, the source has been displaced so that two gamma-rays from a single annihilation event will not be recorded by each detector "in coincidence." At the bottom of the figure, the source and two detectors are again collinear. However, black paper was inserted between the TlBr and the SiPM in order to eliminate optical signals from the TlBr from being detected by the SiPM.

Figure 6:
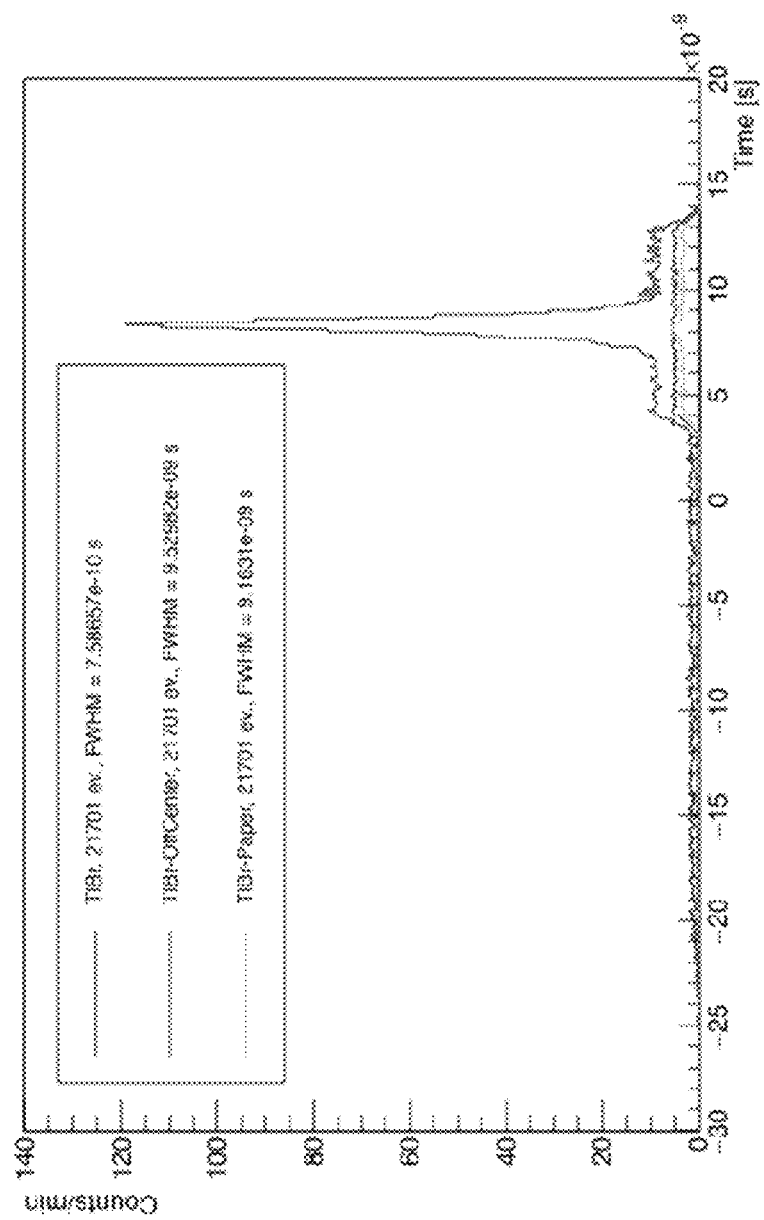
FIG. 6 shows coincidence timing spectra for three experimental configurations, according to certain embodiments.

Shown in FIG. 6 are the raw coincidence time resolution data for the three configurations described in FIG. 5. There is a significant peak only for the first configuration where the detectors and source are collinear and the TlBr is optically coupled to the SiPM. The timing resolution for this case is approximately 760 ps. When the source and detectors are not collinear, there are no true coincident events as indicated by the lack of the significant peak. For the case where the detectors and source are collinear but the optical signal from the TlBr is blocked from being detected by the SiPM by the paper, there is a very small peak, but the data laregely overlaps the second case. This could be due to direct interactions in the SiPM.

Figure 7:
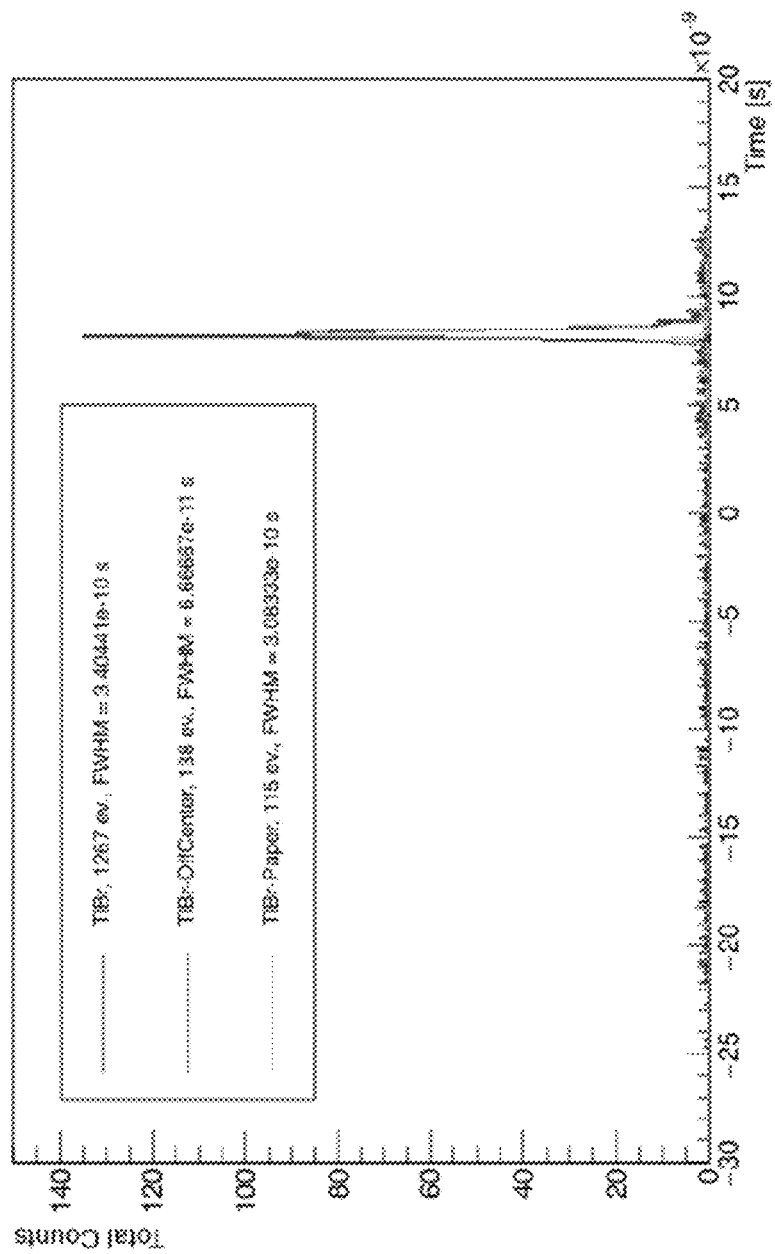
FIG. 7 shows coincidence timing spectra with energy selection for three experimental configurations, according to some embodiments.
Figure 8B:
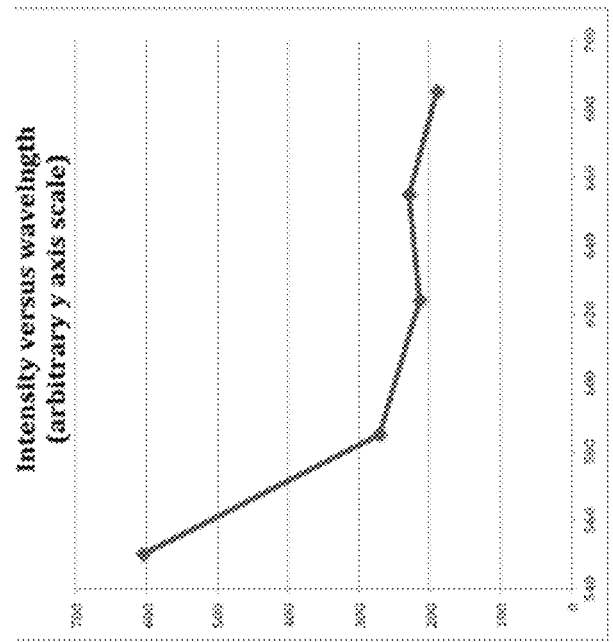
FIG. 8B illustrates, according to certain embodiments, the light measured from TlBr following the dependence of Cherenkov light intensity on wavelength.
Figure 8A:
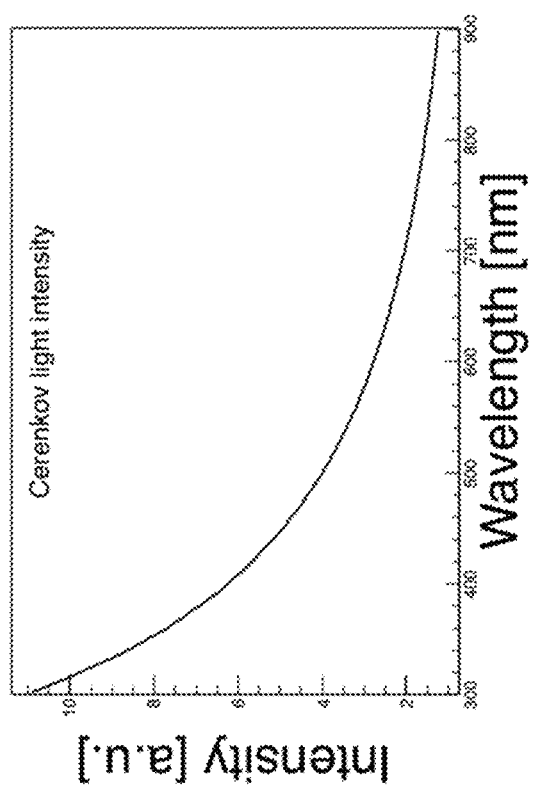
FIG. 8A illustrates, according to certain embodiments, the theoretical light dependence of Cherenkov light intensity on wavelength.

Selecting events based on energy improves the timing resolution. FIG. 7 shows coincidence timing results with energy selection. The timing resolution improved to 340 ps. FIG. 8A shows the theoretical dependence of Cherenkov light intensity on wavelength and FIG. 8B shows the measured from TlBr dependence of Cherenkov light intensity on wavelength. The similarity of the curves is further indication that the optical signal detected is Cherenkov radiation.

What is claimed is:

1. A method for detecting radiation, comprising:
exposing a wide bandgap semiconductor to a source of radiation to generate an electrical signal and an optical signal; and
detecting radiation by measuring the electrical signal and the optical signal, wherein the optical signal measured is generated by Cherenkov light;
obtaining radiation timing information from the optical signal; and
obtaining radiation energy information from the electrical signal.

2. The method of claim 1, wherein the energy, position, and timing of a radiation event is deduced from measuring the combination of the electrical signal and optical signal.

3. The method of claim 1, wherein the wideband gap semiconductor has a band gap of greater than about 1.0 eV.

4. The method of claim 1, wherein the wideband gap semiconductor has a band gap of greater than about 2.0 eV.

5. The method of claim 1, wherein the wideband gap semiconductor has a refractive index of greater than about 1.2.

6. The method of claim 1, wherein the wideband gap semiconductor is selected from the group consisting of thallium halides, Group IV compounds, Group III-V, Group II-VI compounds, Group IV-VI compounds, polynuclear compounds, and mixtures of thereof.

7. The method of claim 1, wherein the wideband gap semiconductor is a thallium halide and/or a mixture of two or more thallium halides.

8. The method of claim 1, wherein the wideband gap semiconductor is thallium bromide.

9. The method of claim 1, wherein the wideband gap semiconductor is selected from the group consisting of $HgX_2$, $Hg_2X_2$, $PbX_2$ and $BiX_3$, wherein X is F, Cl, Br, I or any combination thereof.

10. The method of claim 1, wherein the wideband gap semiconductor comprises one or more elements selected from the group consisting of Tl, Bi, Hg, Pb, Cd, In, Zn, Ga, Al, P, Sb, As, Te, Se, S, O, Au, Ag, I, Br, Cl, F, Si, and C.

11. The method of claim 1, wherein the electrical signals is measured, at least in part, by one or more of components selected from the group consisting of a continuous electrode, a pixelated electrode, a Frisch-Grid design, a coplanar electrode, a hemispherical electrode or surface, a conductive strip and an orthogonal conductive strip.

12. The method of claim 1, wherein the optical signal is measured, at least in part, by one or more components selected from the group consisting of a solid state device, a PIN diode, an avalanche diode, a solid state photomultiplier and a photomultiplier tube.

13. The method of claim 1, wherein the electrical signal and optical signal measurement is done from one or more faces of the detector.

14. The method of claim 1, wherein the electrical signal and optical signal measurement are done from the same face of the detector.

15. The method of claim 1, wherein the electrical signal and optical signal measurement are done from different faces of the detector.

16. The method of claim 1, wherein the optical signal measurement is used as a trigger or a timing signal.

* * * * *